United States Patent [19]
Blodgett

[11] Patent Number: 5,400,289
[45] Date of Patent: Mar. 21, 1995

[54] LOCKOUT CIRCUIT AND METHOD FOR PREVENTING METASTABILITY DURING THE TERMINATION OF A REFRESH MODE

[75] Inventor: Greg A. Blodgett, Eagle, Id.

[73] Assignee: Micron Technology, Inc., Boise, Id.

[21] Appl. No.: 275,693

[22] Filed: Jul. 15, 1994

[51] Int. Cl.⁶ .............................................. G11C 7/00
[52] U.S. Cl. .................................. 365/222; 365/233
[58] Field of Search .................. 365/222, 233, 189.05

[56] References Cited

U.S. PATENT DOCUMENTS 5,295,110  3/1994  Sakakibara ........................ 365/222

Primary Examiner—Joseph A. Popek
Assistant Examiner—A. Zarabian
Attorney, Agent, or Firm—Susan B. Collier

[57] ABSTRACT

A circuit and method for preventing glitches from occurring during a termination of a self-refresh mode when a race condition exits between an external row address strobe signal* (RAS*) transitioning to an inactive state and an internally generated self-refresh timing signal transitioning to an inactive state. The circuit of the invention includes a pulse circuit for generating an active self-refresh cycle pulse and a lock out circuit. The lock out circuit is responsive to the external RAS* signal and the active self-refresh cycle pulse. The lock out circuit locks out the effect of the active self-refresh cycle pulse when an external RAS* signal transitions to an inactive state prior to the generation of the active self-refresh cycle pulse and locks out an effect of a transition of the external RAS* signal to an inactive state when the active self-refresh cycle pulse is present.

18 Claims, 3 Drawing Sheets

LOCKOUT CIRCUIT AND METHOD FOR PREVENTING METASTABILITY DURING THE TERMINATION OF A REFRESH MODE

CROSS REFERENCE TO RELATED APPLICATIONS

This application is being filed simultaneously with and contains similar material to copending application having Ser. No. 08/275576, entitled "A CIRCUIT HAVING A CONTROL ARRAY OF MEMORY CELLS AND A CURRENT SOURCE AND A METHOD FOR GENERATING A SELF-REFRESH TIMING SIGNAL."

FIELD OF THE INVENTION

The invention relates to self-refreshing dynamic random access memories (DRAMs), and more particularly to circuits on the DRAM for preventing metastability during the termination of a refresh mode.

BACKGROUND OF THE INVENTION

A self-refreshing DRAM is a dynamic random access memory which has an autonomous refresh circuit.

DRAMs are comprised of a plurality of memory storage cells in which each cell consists of a transistor and an intrinsic capacitor. The transistors are used to charge and discharge the capacitors to certain voltage levels. The capacitors then store the voltages as binary bits, 1 or 0, representative of the voltage levels. The binary 1 is referred to as a "high" and the binary 0 is referred to as a "low." The voltage value of the information stored in the capacitor of a memory cell is called the logic state of the memory cell. Due to capacitance leakage, the memory storage cells must be refreshed periodically during a refresh mode to keep the capacitors charged or discharged to ensure memory preservation. A refresh cycle normally involves cycling through the memory and performing a read/write operation in each row of the memory, in turn. A sleep mode is typically characterized as a low power mode having no active read or write operations during which data retention is desired. It is typically necessary to refresh each row of memory in the DRAM device within a time period of 4 to 256 milliseconds for data retention.

In order for refresh to occur, an external row address strobe signal* (RAS*) and an internally generated self-refresh timing signal must typically be active. When RAS* transitions to an inactive state, the refresh mode is typically exited. Automatic exiting of the refresh mode without regard to the state of the internally generated self-refresh timing signal may cause metastability of the DRAM due to glitches caused by external RAS* and the internal self-refresh timing signal opposing one another.

Thus there exists a need to prevent glitches from occurring during a termination of a self-refresh mode when a race condition exits between an external RAS* transitioning to an inactive state and an internally generated self-refresh timing signal transitioning to an active state.

There is also a need to vary the period of the refresh cycle and the period of the refresh mode to adjust the rate of refresh for changes in voltage and temperature. Changes in voltage and temperature may vary the rate of leakage of the memory storage cells requiring more or less frequent refreshing of the DRAM.

SUMMARY OF THE INVENTION

A self-refresh circuit and method for generating an internal row address strobe signal at an output node of the self-refresh circuit of a dynamic random access memory device comprising a timing circuit for generating a first timing signal and a second timing signal, a pulse circuit for generating an active self-refresh cycle pulse having a desired pulse width in response to the second timing signal, an output circuit having a first input node for accepting the first timing signal and having a second input node for accepting the active self-refresh cycle pulse, the output circuit generating the internal row address strobe signal at the output node of the self-refresh circuit for each occurrence of the active self-refresh cycle pulse when enabled by an active state of the first timing signal on the first input node, and a lockout circuit responsive to the active self-refresh cycle pulse and an external row address strobe signal, the lockout circuit latching the active state of the first timing signal to the first input node in response to the external row address strobe signal being in an active state and the lockout circuit latching the active state of the first timing signal to the first input node in response to the active self-refresh cycle pulse, and the lockout circuit retaining the first timing signal on the first input node by locking out an effect of a transition of the active self-refresh cycle pulse to an inactive sate when the external row address strobe signal is in the active state and locking out an effect of a transition of the external row address strobe to an inactive state when the active self-refresh cycle pulse is present, the lockout circuit thereby preventing metastability at a termination of the refresh.

DETAILED DESCRIPTION OF THE INVENTION

The invention is a self-refreshing dynamic random access memory (DRAM) device having a plurality of memory storage cells for storing electronic data. The memory storage cells leak charge and must be refreshed. In one embodiment the invention is an oscillator circuit of the self-refreshing DRAM. The oscillator circuit of the invention generates an internal clock signal. A counter counts the pulses of the internal clock signal and generates a self-refresh mode signal for initiating the self-refresh mode in the DRAM device and generates a self-refresh cycle signal for initiating each self-refresh cycle during the self-refresh mode.

Figure 1:
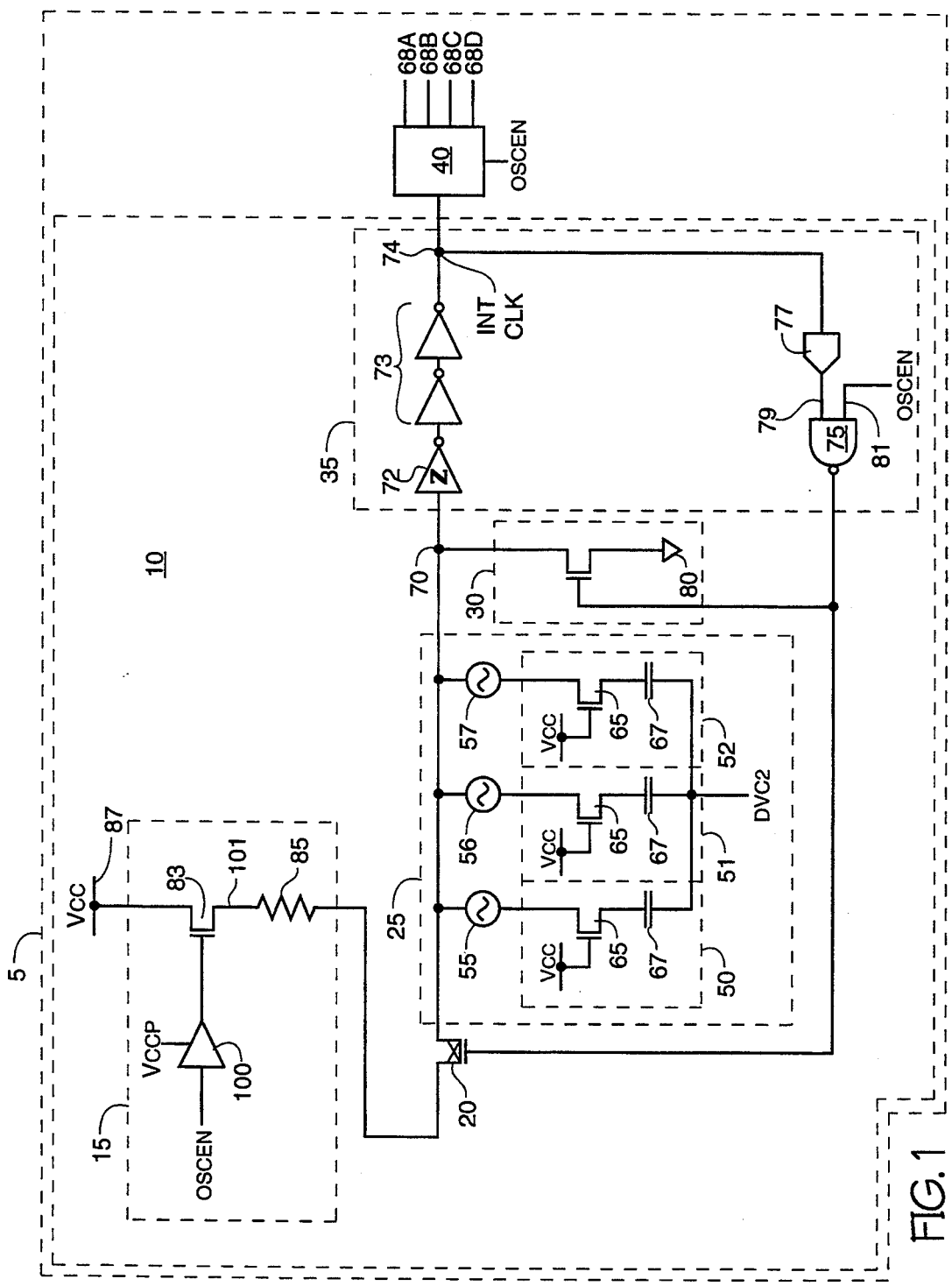
FIG. 1 is a schematic of the oscillator circuit of the invention.

FIG. 1 is a schematic of a DRAM device 5 having the oscillator circuit 10 of the invention. The oscillator circuit 10 functions as a timing circuit and generates at lest one self-refresh timing signal. The oscillator circuit 10 comprises a current source 15, a switching device 20, a capacitor portion 25, a discharge circuit 30, and a monitor circuit 35. The DRAM device 5 also has a counter 40 for counting the internal clock signal generated by the oscillator circuit.

The capacitor portion 25 is charged to a potential by current source 15 when switching device 20 is actuated. The monitor circuit 35 monitors the potential of node 70. Node 70 is driven to a potential equal to the potential stored in capacitor portion 25. The monitor circuit 35 signals the discharge device 30 and switching device 20 when the potential reaches a desired value and provides an internal clock signal to the counter 40.

The capacitor portion 25 comprises three control arrays 50–52. Although each control array 50–52 is represented by only one control cell in the figure, each control array 50–52 actually comprises a plurality of control cells. In this embodiment there are 36 control cells in each control array 50–52. Although the exact number of control cells may vary it is advisable to use a sufficient number of control cells to ensure that an average cell of the control arrays 50–52 is representative of an average memory storage cell of the self-refreshing DRAM. The control cells are fabricated to have the same structure and size as the memory storage cells of the DRAM, although larger geometries may be used to ensure manufacturability. Using identical fabrication during array fabrication ensures that control arrays 50–52 and the memory storage arrays of the DRAM react identically to changes in temperature and voltage. Each control cell is a continually actuated transistor 65 connected serially to a storage capacitor 67.

Each control array 50–52 can be electrically isolated from the circuit by opening a fuse 55–57, respectively. Electrically isolating a control array increases the frequency of the self-refresh timing signal.

The potential on node 70 is inverted in schmitt trigger 72 and is buffered in inverters 73 to generate the internal clock signal at node 74. The schmitt trigger has a high trip point and a low trip point. When the potential at node 70 reaches the high trip point the output of the schmitt trigger is inverted from its input potential on node 70 after a time delay internal to the schmitt trigger. The output of the schmitt trigger does not transition again until the potential at node 70 decreases to the low trip point of the schmitt trigger. Node 74 is the clock input node to counter 40. The internal clock signal represents the inverse of the potential of capacitors 67 when they are charged and discharged. The internal clock signal has a period. The counter circuit 40 counts the number of periods of the internal clock signal and generates an active self-refresh mode signal at node 68A and generates self-refresh cycle signals at nodes 68B–D. The first active self-refresh timing signal following the enablement of the oscillator circuit 10 is a self-refresh mode signal for initiating self-refresh in the DRAM device 5. The self-refresh mode signal is driven to node 68A. The self-refresh timing signal following the self-refresh mode signal are self-refresh cycle signals. The self-refresh cycle signals are driven to nodes 68B–D. The DRAM 5 is refreshed in response to the self-refresh cycle signal until the self-refresh mode is exited.

The internal clock signal at node 74 is also fed back to NAND gate 75 through delay circuit 77. The NAND gate 75 output signal controls the charge and discharge of the capacitor portion 25. When the potential on node 70 reaches the high trip point of the schmitt trigger 72, node 74 goes low after a time delay. The low on node 74 is further delayed through delay circuit 77 and takes the output of NAND gate 75 to a high potential. The high potential deactivates p-channel transistor 20 and actuates the n-channel transistor of discharge circuit 30 discharging the capacitor portion 25 through the transistor of discharge circuit 30. When the potential of node 70 reaches the low trip point of the schmitt trigger 72, the output of the schmitt trigger 72 transitions to a high potential, and the potential of node 74 transitions to a high which is delayed in delay circuit 77. The high potential fed back to NAND input node 79 causes the output of the NAND gate 75 to go low when the oscillator enable signal on input node 81 is high. The low NAND gate 75 output signal actuates transistor 20 coupling current source 15 to the capacitor portion 25 and deactuates the transistor of discharge circuit 30 isolating the capacitor portion 25 from the ground potential at reference node 80. The capacitor portion 25 now begins to recharge to a high potential through actuated transistor 20.

The current source 15 comprises an n-channel transistor 83 for sourcing current between the capacitor portion 25 and a supply potential ($V_{cc}$, typically equal to potential lying between 5 Volts and 3 volts), connected at node 87, during the charging of the capacitor portion 25 and comprises a resistor 85 for controlling the amount of current sourced. An oscillator enable signal (OSCEN), generated in response to external signals, is driven to the gate of transistor 83 through a level translating buffer circuit 100 to control the activation and deactivation of n-channel transistor 83. The level translating buffer circuit 100 buffers a potential to the gate of transistor 83 which is large enough to pull the potential of node 101 to the full $V_{cc}$ potential at node 87 when transistor 83 is actuated.

Figure 2:
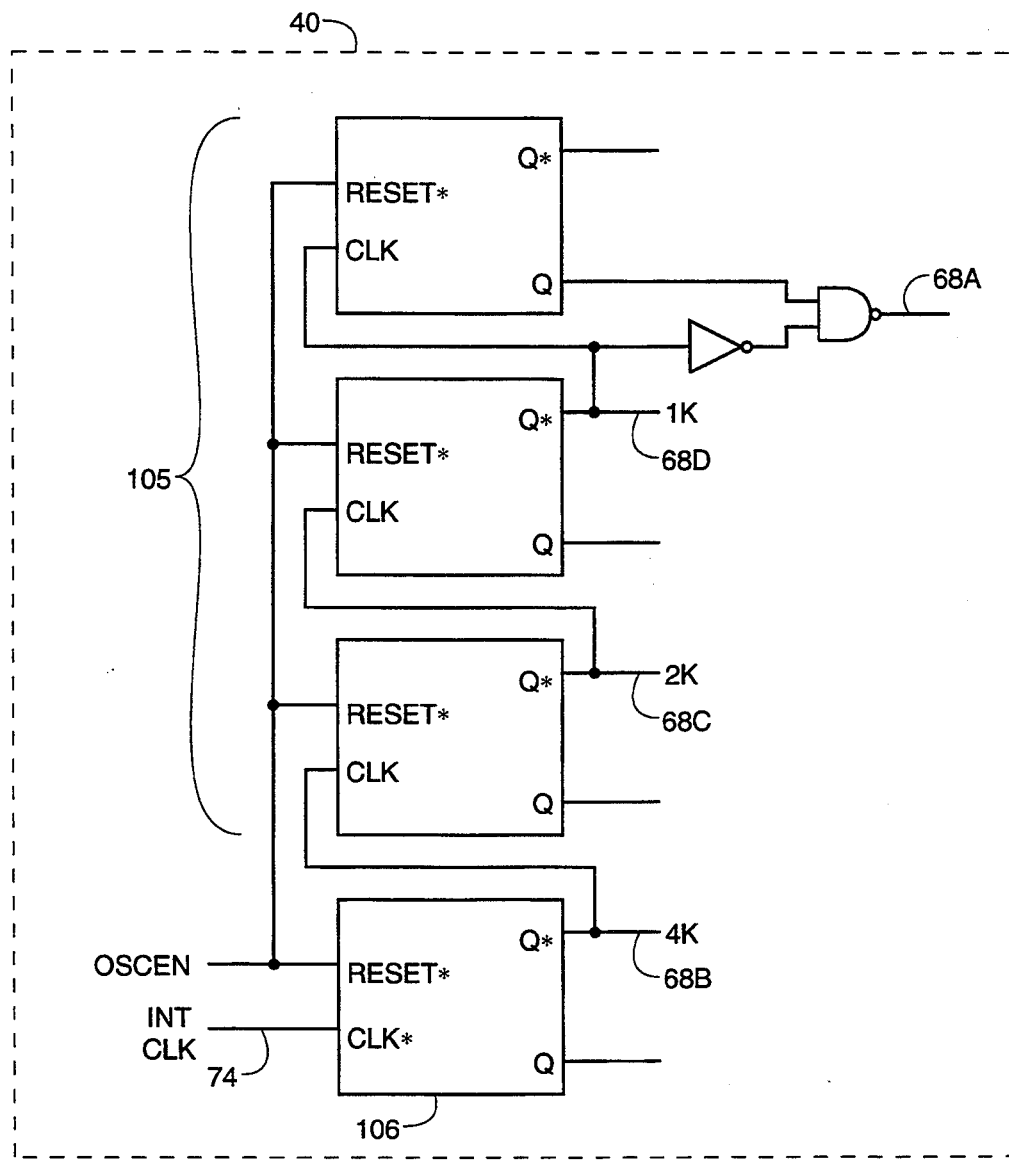
FIG. 2 is a detailed schematic of a counter circuit.

Counters are well known in the art. FIG. 2 is one possible counter circuit which may be used for counter 40 in the DRAM of the invention. Like components in FIGS. 1 and 2 are numbered the same. The counter 40 comprises 3 positive edge triggered flip-flops 105 and a negative edge triggered flip flop 106.

The frequency of the monitor signal at node 74 is approximately 75 KHz with all three fuses 55–57 electrically conductive. The counter 40 provides the self-refresh mode signal at node 68A after 24 periods of the internal clock signal. The self-refresh mode has a time-out approximately equal to 300 micro seconds. The counter also provides self-refresh cycle signals at nodes 68B, 68C, and 68D having frequencies of 18.75 KHz, 9.4 KHz and 4.7 KHz for generating row address strobe (RAS)* pulses for 4K, 2K or 1K refresh parts, respectively. This corresponds to a refresh rate of 200 milliseconds.

Figure 3:
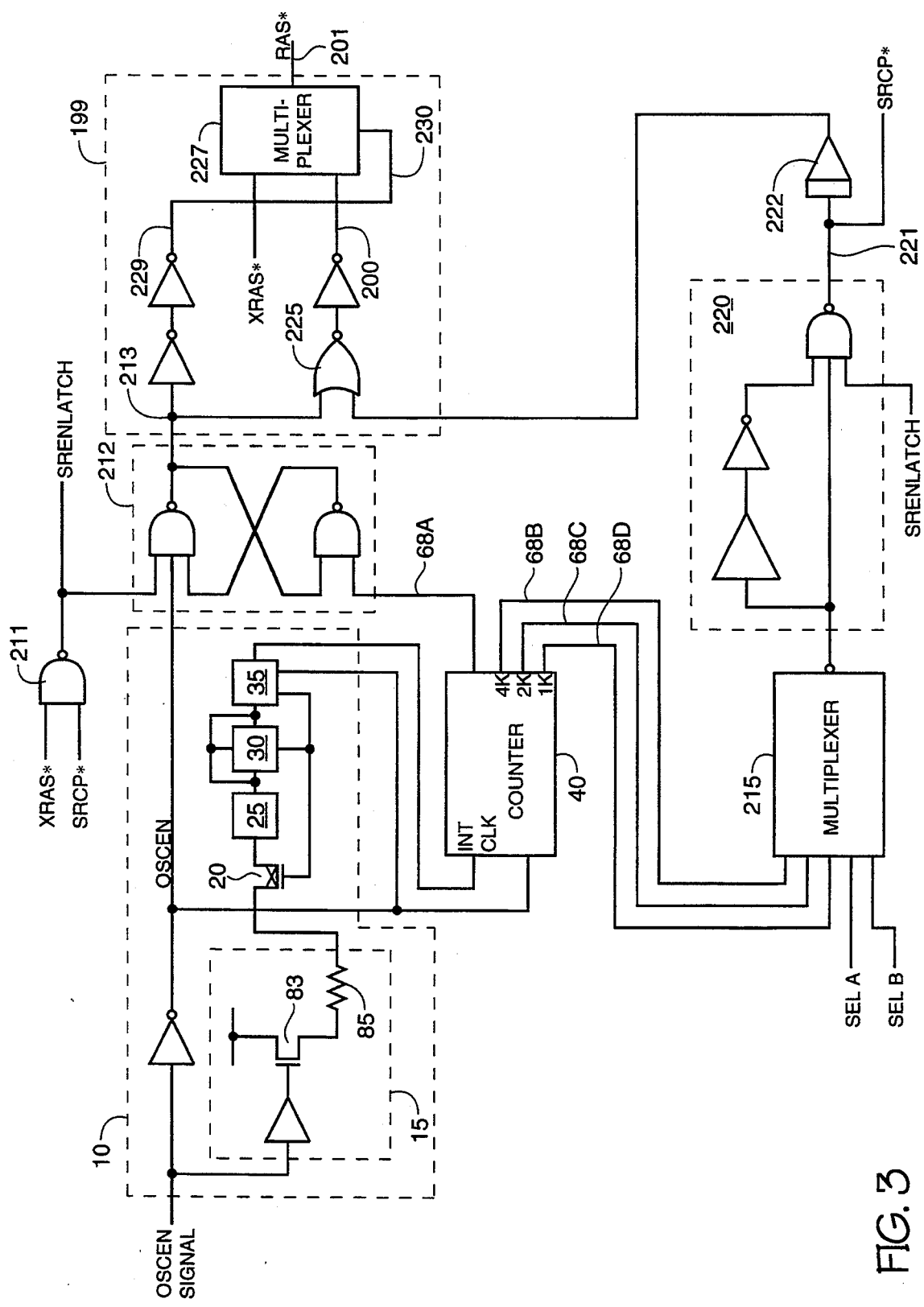
FIG. 3 is a schematic of a portion of a dynamic random access memory device of the invention.

In FIG. 3 a further embodiment of the invention is shown. Like components in FIGS. 1 and 3 are numbered the same. The oscillator enable signal, generated in response to a CAS before RAS (CBR), is buffered to current source 15 where it controls the activation and deactivation of transistor 83. (CAS is column address strobe.) The oscillator enable signal is also inverted to the input of the monitor circuit 35 and to an input of the counter circuit 40.

The self-refresh mode signal at output node 68A of counter 40 is designed to enable an output circuit portion 199 to drive a self-refresh cycle pulse, (SRCP*) signal from node 200 to an output node 201. A NAND gate 211 is used to lock out an inactive external RAS, (XRAS*) occurring during the generation of an active SRCP* so that glitches do not occur during exit from the self-refresh mode. A latch 212 is used to latch the active self-refresh mode signal, in this case a low, to node 213 when the output signal, SRENLATCH (self-refresh enable latch), of NAND gate 211 is high in order that the self-refresh mode is not exited by the self-refresh mode signal on 68A transitioning. At the termination of refresh SRENLATCH transitions low and disables a generation of the active SRCP*.

A 4K self-refresh cycle signal, a 2K self-refresh cycle signal, and a 1-K self-refresh cycle signal are available at counter output nodes 68B–D respectively and are multiplexed in a three to one multiplexer 215 which is controlled by two select input signals, SELA and SELB, which together determine whether the part is a 4K, 2K or 1K refresh part. The output of the multiplexer 215 is an input signal to pulse generator 220. In the present embodiment the pulse generator 220 provides a 15 nanosecond active SRCP* pulse at node 221 when enabled by a high SRENLATCH signal at the output of NAND gate 211. The SRCP* is active low. The SRCP* is an input to NAND gate 211. When the XRAS, is active, low, the output, SRENLATCH, of NAND gate 211 is high. Thus if XRAS* transitions high during the termination of the self-refresh cycle and the SRCP* is low the output signal, SRENLATCH, of NAND gate 211 remains high thereby locking out the transition of XRAS* until the SRCP* transitions high.

It is possible within the scope of the invention to use a pulse generator which generates pulses having pulse widths other than 15 nanoseconds.

On the other hand if the XRAS* signal transitions high when SRCP* is high, the NAND gate 211 output, SRENLATCH, goes low. The low SRENLATCH is fed back as an input to pulse generator 220. The low SRENLATCH disables pulse generator circuit 220 and SRCP* remains high thereby latching a high to node 213 allowing a glitch free exit from the self-refresh mode. Thus NAND gate 211 and the latch circuit 212 form a lock out circuit which locks out a transition in XRAS* or a transition of the SRCP* at the termination of the self-refresh mode.

The SRCP, at node 221 is delayed in delay circuit 222 to the input of NOR gate 225 which is enabled and disabled by the signal latched to node 213 by latch circuit 212. This delay ensures that the active SRCP* does not reach the NOR gate 225 before NOR gate 225 is properly enabled or disabled. This delay is particularly important in the case where the SRCP* begins to transition to an active state following the transition of the XRAS* to the inactive state. The SRCP* is delayed in delay circuit 222 in order to allow node 213 to transition high thereby disabling the NOR gate 225.

Multiplexer 227 in an output circuit portion 199 provides an internal RAS pulse at its output node 201. During the self-refresh mode the SRCP* on node 200 is multiplexed to the output by the active self-refresh mode signal on node 213 which is buffered to node 230 to function as a select input to multiplexer 227. When XRAS* transitions high and the SRCP* is high the latch drives the potential of node 213 to a high potential. The high potential on node 213 is buffered to node 230 where it selects XRAS* as the internal RAS output signal of multiplexer 227. Thus the invention prevents metastability during an exit from the self-refresh mode.

While this invention has been described with reference to an illustrative embodiment, this description is not intended to be construed in a limiting sense. Various modifications as well as other embodiments will be apparent to persons skilled in the art upon reference to this description. It is, therefore contemplated that the appended claims cover any such modifications or embodiments as fall within the true scope of the invention.

What is claimed is:

1. A circuit for preventing glitches from occurring during a termination of a self-refresh mode comprising:
   a) a pulse circuit for generating an active self-refresh cycle pulse in response to an internally generated self-refresh timing signal; and
   b) a lockout circuit responsive to an external row address strobe signal and the active self-refresh cycle pulse, said lockout circuit locking out an effect of the active self-refresh cycle pulse when the external row address strobe signal transitions to an inactive state prior to the generation of the active self-refresh cycle pulse and locking out an effect of a transition of the external row address strobe signal to an inactive state when the active self-refresh cycle pulse is present.

2. A self-refresh circuit of a dynamic random access memory device, the self-refresh circuit for generating an internal row address strobe signal at an output node of said self-refresh circuit, the self-refresh circuit comprising:
   a) a timing circuit for generating a first timing signal and a second timing signal;
   b) a pulse circuit for generating an active self-refresh cycle pulse having a desired pulse width in response to said second timing signal;
   c) an output circuit having a first input node for accepting said first timing signal and having a second input node for accepting said active self-refresh cycle pulse, said output circuit generating the internal row address strobe signal at the output node of the self-refresh circuit for each occurrence of said active self-refresh cycle pulse when enabled by an active state of said first timing signal on said first input node; and
   d) a lockout circuit responsive to said active self-refresh cycle pulse and an external row address strobe signal, said lockout circuit latching the active state of said first timing signal to said first input node in response to said external row address strobe signal being in an active state and said lockout circuit latching the active state of said first timing signal to said first input node in response to said active self-refresh cycle pulse, and said lockout circuit retaining said first timing signal on said first input node by locking out an effect of a transition of the active self-refresh cycle pulse to an inactive sate when said external row address strobe signal is in the active state and locking out an effect of a transition of said external row address strobe to an inactive state when said active self-refresh cycle pulse is present, said lockout circuit thereby preventing metastability at a termination of the refresh.

3. A self-refresh circuit of a dynamic random access memory device, the self-refresh circuit for generating an internal row address strobe signal at an output node of said self-refresh circuit, the self-refresh circuit comprising:
   a) a timing circuit for generating a first timing signal and a second timing signal;
   b) a pulse circuit for generating an active self-refresh cycle pulse having a desired pulse width in response to said second timing signal;
   c) a gate circuit responsive to said active self-refresh cycle pulse and an external row address strobe signal, said gate circuit generating a first gate signal in response to said external row address strobe signal being active and generating said first gate signal in response to said active self-refresh cycle pulse and said gate circuit generating a second gate signal in response to said row address strobe signal being inactive and said active self-refresh cycle pulse transitioning to an inactive state;

d) an output circuit having a first input node for accepting said first timing signal and having a second input node for accepting said active self-refresh cycle pulse, said output circuit generating the internal row address strobe signal at the output node of the self-refresh circuit for each occurrence of said active self-refresh cycle pulse when enabled by an active state of said first timing signal on said first input node; and e) a latch circuit for latching the active state of said first timing signal to said first input node in response to said first gate signal, said gate circuit and said latch circuit locking out an effect of an occurrence of the active self-refresh cycle pulse when said external row address strobe signal is in an inactive state and for locking out an effect of a transition of said external row address strobe to said inactive state when said active self-refresh cycle pulse is present, said gate circuit controlling said latch circuit in order to retain the active state of the first timing signal at the latch node during the locking out of the effect of the occurrence of the active self-refresh cycle pulse when the external row address strobe signal is in the inactive state and during the locking out of the effect of the transition of said external row address strobe signal to the inactive state when said active self-refresh cycle pulse is present thereby preventing metastability at a termination of the refresh.

4. The self-refresh circuit as specified in claim 3, wherein said second gate signal disables said pulse circuit to terminate the generating of the active self-refresh cycle pulse.

5. The self-refresh circuit as specified in claim 3, wherein said second gate signal disables said latch circuit thereby allowing said first timing signal to transition to an inactive state at said first input node.

6. The self-refresh circuit as specified in claim 3, wherein said timing circuit comprises:

a) an oscillator circuit for generating an internal clock signal; and b) a counter circuit in electrical communication with said oscillator circuit, said counter circuit counting periods of the internal clock signal and generating said first and said second timing signals in response to a first and a second number of said periods respectively.

7. A self-refresh circuit of a dynamic random access memory device, the self-refresh circuit for generating an internal row address strobe signal at an output node of said self-refresh circuit, the self-refresh circuit comprising:

a) a timing circuit for generating a first timing signal and a second timing signal;

b) a pulse circuit for generating an active self-refresh cycle pulse having a desired pulse width in response to said second timing signal;

c) a gate circuit responsive to said active self-refresh cycle pulse and an external row address strobe signal, said gate circuit generating a first gate signal in response to said external row address strobe signal being active and generating said first gate signal in response to said active self-refresh cycle pulse and said gate circuit generating a second gate signal in response to said row address strobe signal being inactive and said active self-refresh cycle pulse transitioning to an inactive state;

d) an output circuit having a first input node for accepting said first timing signal and having a second input node for accepting said active self-refresh cycle pulse, said output circuit generating the internal row address strobe signal at the output node of the self-refresh circuit for each occurrence of said active self-refresh cycle pulse when enabled by an active state of said first timing signal on said first input node; and e) a feed back node serially connecting an input node of said pulse circuit and an output node of said gate circuit, said first gate signal enabling said pulse circuit for the generating of the active self-refresh cycle pulse and said second gate signal disabling said pulse circuit thereby terminating the generating of the active self-refresh cycle pulse and the generating of the internal row address strobe signal for self-refresh.

8. A dynamic random access memory device having a plurality of memory storage cells for storing electronic data, the dynamic random access memory device performing a refresh in response to an external row address strobe signal in order to refresh the data, said dynamic random access memory device generating an internal clock signal for controlling a timing of the refresh, the dynamic random access memory device comprising:

a) a control memory cell capable of charge and discharge;

b) a current source for charging said control memory cell to a potential;

c) a monitor circuit for monitoring the potential on said control memory cell to determine when the potential of said control memory cell reaches a trip point;

d) a discharge circuit for discharging said control memory cell in response to the potential on said control memory cell reaching the trip point, a rate of the charge and the discharge of said control memory cell determining a frequency of the internal clock signal;

e) a pulse circuit for generating an active self-refresh cycle pulse in response to the internal clock signal; and f) a lockout circuit responsive to the external row address strobe signal and the active self-refresh cycle pulse, said lockout circuit locking out an effect of the active self-refresh cycle pulse when the external row address strobe signal transitions to an inactive state prior to the generation of the active self-refresh cycle pulse and locking out an effect of a transition of the external row address strobe signal to an inactive state when the active self-refresh cycle pulse is present.

9. A method for generating an internal row address strobe signal in a dynamic random access memory device comprising the following steps:

a) generating an internal clock signal to initiate refresh and to control a period of a refresh cycle;

b) counting a number of periods of said internal clock signal;

c) generating an active self-refresh cycle signal after a first desired number of counts of said periods of said internal clock signal;

d) generating an active self- refresh cycle pulse by controlling a pulse width in response to a transition of said self-refresh cycle signal;

e) generating an active self-refresh mode signal after a second desired number of counts of said periods of said internal clock signal;

f) latching said active self-refresh mode signal to a control node when an external row address strobe signal is in an active state;

g) latching said active self-refresh mode signal to said control node in response to said active self-refresh cycle pulse; and h) providing an internal row address strobe signal in response to said active self-refresh cycle pulse when said active self-refresh mode signal is latched to said control node.

10. The method as specified in claim 9 further comprising the step of locking out a transition of said external row address strobe signal to an inactive state when said active self-refresh cycle pulse is present thereby retaining said active self-refresh mode signal at said control node.

11. The method as specified in claim 9 further comprising the step of locking out a transition of said active self-refresh cycle pulse to an inactive state when said external row address strobe signal is active thereby retaining said self-refresh mode signal at said control node.

12. The method as specified in claim 9 further comprising the step of terminating said step of generating said active self-refresh cycle pulse in response to said external row address strobe signal being inactive during an absence of said active self-refresh cycle pulse.

13. The method as specified in claim 9 further comprising the following steps:

a) enabling a control gate with said active self-refresh mode signal;

b) driving said active self-refresh cycle pulse to an input of said control gate; and c) delaying said step of driving to ensure said control gate is enabled prior to said active self-refresh cycle pulse being present at said input of said control gate.

14. The method as specified in claim 9 further comprising the step of terminating said active self-refresh mode in said dynamic random access device without glitches by locking out an effect of said active self-refresh cycle pulse when said active self-refresh cycle pulse occurs subsequent to an external row address strobe signal transitioning to an inactive state and locking out an effect of said external row address strobe signal transitioning to an inactive state when said active self-refresh cycle pulse is present.

15. A method for refreshing a dynamic random access memory device comprising the following steps:

a) generating a self-refresh cycle signal;

b) generating a self-refresh mode signal;

c) generating an active self-refresh pulse having a desired pulse width in response to said self-refresh cycle signal;

d) latching said self-refresh mode signal to an enable node in response to an external row address strobe signal being in an active state;

e) enabling the dynamic random access memory device for the refreshing in response to the self-refresh mode signal latched at the enable node; and f) refreshing the dynamic random access memory device cells in response to the self-refresh cycle signal.

16. The method as specified in claim 15 further comprising the step of disabling the dynamic random access memory device for the refreshing when said active self-refresh pulse transitions to an inactive state and when said external row address strobe signal is in an inactive state.

17. The method as specified in claim 15 further comprising the step of locking out an effect of said externally generated row address strobe signal going to an inactive state when said active self-refresh pulse is present, said step of locking out eliminating metastability during said step of disabling.

18. The method as specified in claim 15 further comprising the step of locking out an effect of said active self-refresh pulse when said active self-refresh pulse occurs subsequent to said step of disabling, said step of locking out eliminating metastability during said step of disabling.

* * * * *